United States Patent
Ito

(10) Patent No.: US 7,227,810 B2
(45) Date of Patent: Jun. 5, 2007

(54) SEMICONDUCTOR DEVICE AND TESTING METHOD FOR SEMICONDUCTOR DEVICE

(75) Inventor: Munehiro Ito, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 25 days.

(21) Appl. No.: 11/262,937

(22) Filed: Nov. 1, 2005

(65) Prior Publication Data
US 2006/0092753 A1    May 4, 2006

(30) Foreign Application Priority Data
Nov. 2, 2004    (JP)    ............................. 2004-319079

(51) Int. Cl.
*G11C 8/00*    (2006.01)
(52) U.S. Cl. ...................... 365/233; 365/201; 365/203; 365/194
(58) Field of Classification Search ................ 365/233, 365/201, 203, 194
See application file for complete search history.

(56) References Cited

U.S. PATENT DOCUMENTS 6,104,651 A * 8/2000 Cowles et al. .............. 365/201
6,269,036 B1 * 7/2001 Shubat ........................ 365/201
6,794,678 B2 * 9/2004 Hasegawa et al. ............ 257/48
6,907,555 B1 * 6/2005 Nomura et al. ............. 714/719
7,162,671 B2 * 1/2007 Hasegawa et al. .......... 714/718

FOREIGN PATENT DOCUMENTS

JP    2002-230999    8/2002

* cited by examiner

*Primary Examiner*—Son Dinh
*Assistant Examiner*—Toan Le
(74) *Attorney, Agent, or Firm*—McGinn IP Law Group, PLLC

(57) ABSTRACT

To test a memory operation at as high speeds as high clock frequencies only with low clock frequencies. A semiconductor device according to an embodiment of the present invention includes: a clock output part; and a delay circuit, the clock output part setting a first state in accordance with an input of a first clock, setting a second state in accordance with an input of a delay clock from the delay circuit, and setting a third state in accordance with an input of a second clock, and the delay circuit delaying the first clock to output the delayed first clock as the delay clock. With this configuration, it is possible to test precharge and read/write access processings at as high operational speeds as high clock frequencies.

8 Claims, 8 Drawing Sheets

SEMICONDUCTOR DEVICE AND TESTING METHOD FOR SEMICONDUCTOR DEVICE

BACKGROUND OF THE INVENTION

1. Field of the Invention

The present invention relates to a semiconductor device and a testing method for a semiconductor device. In particular, the invention relates to a semiconductor device and a testing method for a semiconductor device, both of which are used for testing two consecutive states.

2. Description of Related Art

Along with a recent tendency toward high-speed processors, memories have required high-speed processing as well as a large capacity. According as the memories have achieved high performance, a variety of tests are required for the memories. To that end, attentions have been paid to the way to test the memories.

What are necessary for testing the memories are the test accuracy high enough to reliably confirm a normal operation, and the lowest possible cost of the test.

In order to enhance the test accuracy, it is necessary to execute the test under the environments as similar to the actual operational environments as possible. Thus, an operational clock for testing the memory is desirably similar to the actual operational clock. In most cases, however, the test is executed at low clock frequencies in consideration of cyclic redundancy check.

As a measure therefor, there has been proposed a testing method that enables the high-speed test by means of an internal delay circuit or the like, even if the low clock frequencies can only be externally applied (see Japanese Unexamined Patent Publication No. 2002-230999, for instance).

The related art is described hereinbelow. FIG. 8 shows a configuration example and timing example of a semiconductor device of the related art. The device shown in FIG. 8 is connected with an evaluating tester, and provided with a clock/address controller circuit, a function controller circuit, a data controller circuit, and a RAM macro operable at high speeds.

The clock/address controller circuit receives two kinds of external clock, CLKA and CLKB from the evaluating tester to generate TCLK based on CLKA and CLKB to be sent to the RAM macro. Here, two-phase clock signals, CLKA and CLKB are unnecessary except when the memory is tested. A clock signal corresponding to TCLK may be directly generated and supplied to the RAM macro in the actual operation. The RAM macro runs based on TCLK output from the clock/address controller circuit. Further, the clock/address controller circuit also receives an external address to access the corresponding address of the RAM macro.

The function controller circuit receives control signals for reading, writing, and refreshing from the evaluating tester to control the RAM macro in accordance with the received control signals. The data controller circuit receives data to be written from the evaluating tester to write this data to the RAM macro. Besides, the data controller circuit receives data read from the RAM macro to output this data to the evaluating tester.

The timing charts of the input of the external address (ADD), the access to the RAM macro in accordance with the address (INT_ADD), and the data output from the RAM macro (TQ) are shown in FIG. 8. As regards the access to the RAM macro, the bit line is precharged during the time of tRP of FIG. 8. During the time of tRAS, the voltage level of the word line is raised to write/read data to/from a corresponding memory cell. That is, in order to shorten tRP, a time period from the rising edge of CLKB to the falling edge of CLKA have to be reduced.

According to the method of the related art, however, either the precharge, or the read/write access can be executed at high speeds, so both of them cannot be carried out at high speeds. This results in a problem that an operation failure that would occur only when both of them are carried out at high speeds cannot be detected. In addition, although Japanese Unexamined Patent Publication No. 2002-230999 describes the method of testing a high-speed RAM using a low-speed tester, this related art can only execute either the precharge or the read/write access at high speeds and cannot execute both of them at high speeds like the related art of FIG. 8.

As mentioned above, the conventional memory testing method has a problem that provided the low clock frequencies are applied, the read/write test for the memory that would be carried out during the precharge and read/write access processings cannot be concurrently executed during both of the precharge processing and read/write access processing at much higher actual operational clock frequencies.

SUMMARY OF THE INVENTION

According to an aspect of the present invention, a semiconductor device includes: a clock output part; and a delay circuit, the clock output part setting a first state in accordance with an input of a first clock, setting a second state in accordance with an input of a delay clock from the delay circuit, and setting a third state in accordance with an input of a second clock, and the delay circuit delaying the first clock to output the delayed first clock as the delay clock. With this configuration, it is possible to test precharge and read/write access processings at an operational speed equivalent to high operational clock frequencies.

According to another aspect of the present invention, a testing method for a semiconductor device includes: setting a first state in accordance with an input of a first clock; outputting a delay clock obtained by delaying the first clock; setting a second state in accordance with an input of the delay clock; and setting a third state in accordance with an input of a second clock. According to this method, it is possible to test precharge and read/write access processings at an operational speed equivalent to high operational clock frequencies.

According to the present invention, it is possible that provided low clock frequencies are applied, the read/write test for the memory that would be carried out during the precharge and read/write access processings can be concurrently executed during both of the precharge processing and read/write access processings at much higher actual operational clock frequencies, and a high-accuracy test can be executed for a short time.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
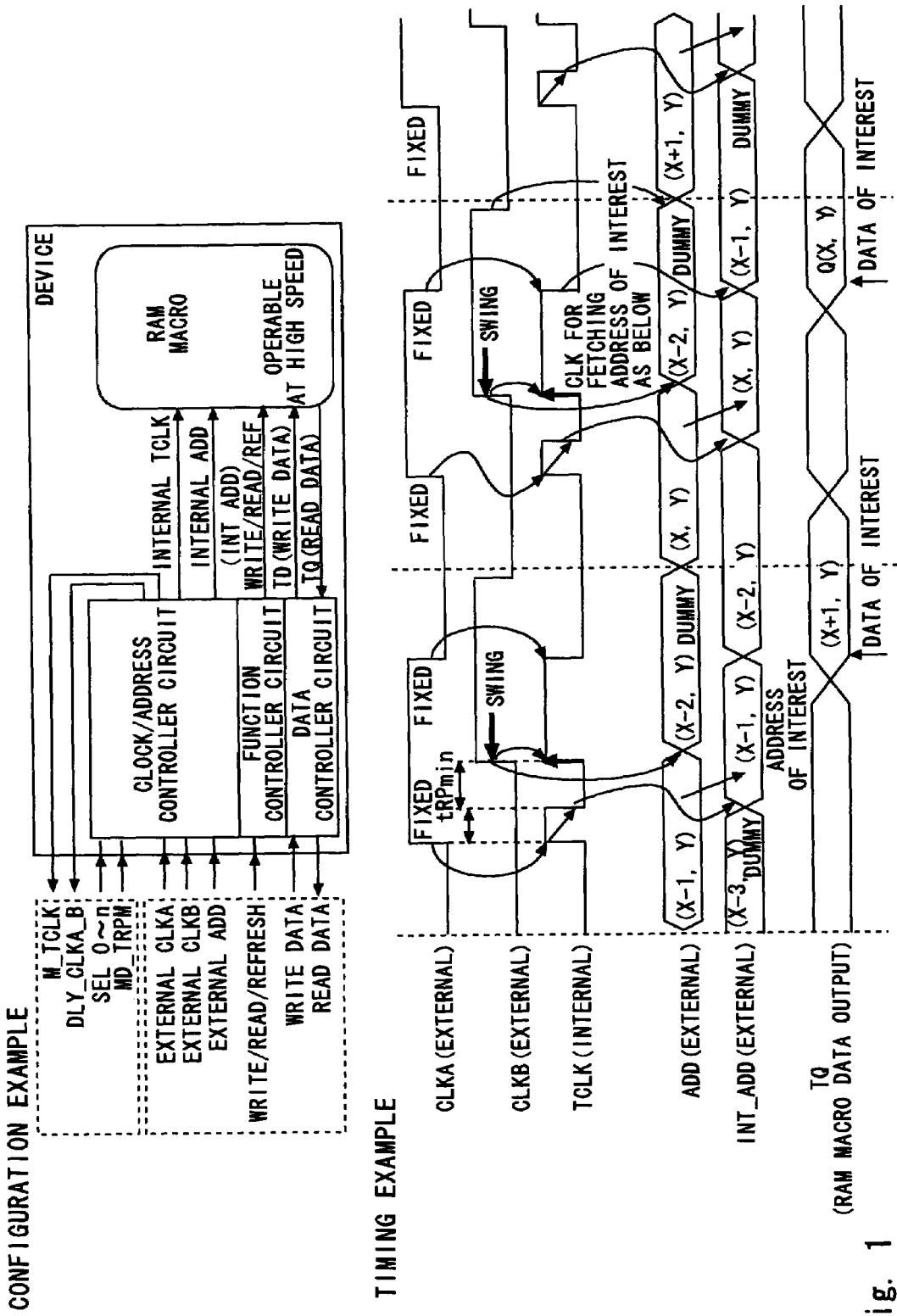
FIG. 1 shows a configuration example and timing example of a semiconductor device according to an embodiment of the present invention.

FIG. 1 shows a configuration example of a semiconductor device according to a first embodiment of the present invention. During the test operation, the device of FIG. 1 is connected with an evaluating tester. The device has a clock/address controller circuit, a function controller circuit, a data controller circuit, and a RAM macro operable at high speeds.

The clock/address controller circuit receives two kinds of external clock, CLKA and CLKB from the evaluating tester to send TCLK generated on the basis of CLKA and CLKB to the RAM macro. The RAM macro runs in response to TCLK output from the clock/address controller circuit. Further, the clock/address controller circuit receives the external address to access the corresponding address of the RAM macro. Further, the clock/address controller circuit receives a selector signal and a tRPmin test signal from the evaluating tester as well as sends a TCLK monitor signal and a CLKA delay opposite-phase signal to the evaluating tester. A detailed description thereof is given below.

The function controller circuit receives from the evaluating tester, control signals for reading, writing, or refreshing. The function controller circuit controls the RAM macro in accordance with the received control signals. The data controller circuit receives data to be written from the evaluating tester to write this data to the RAM macro, or outputs data read from the RAM macro to the evaluating tester.

Figure 2:
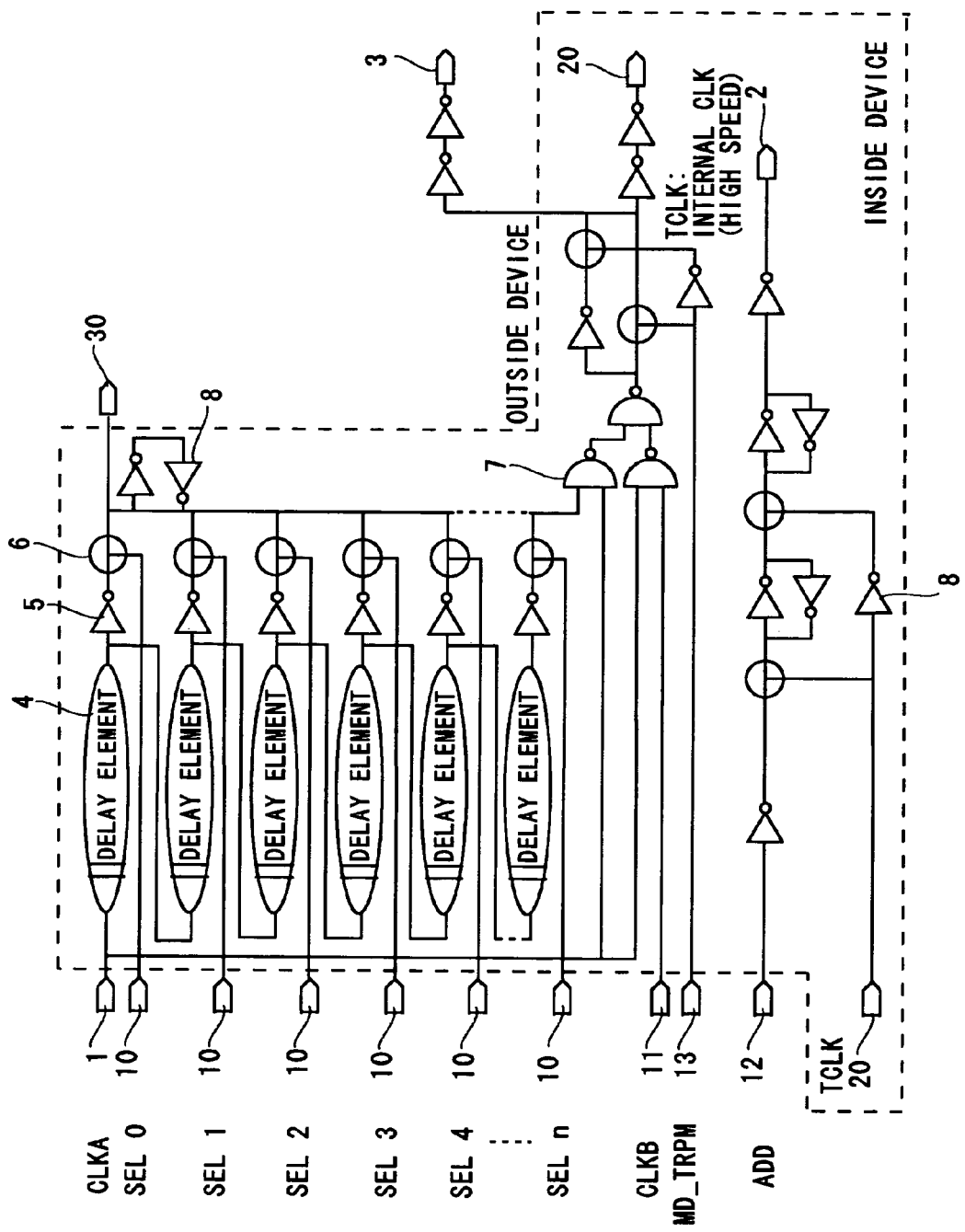
FIG. 2 is a circuit diagram showing the configuration of a clock/address controller circuit according to an embodiment of the present invention.

FIG. 2 is a block diagram showing the detailed configuration of the clock/address controller circuit. The clock/address controller circuit includes a first clock (CLKA) input terminal 1, an internal address output terminal 2, a clock monitor signal output terminal 3, a delay element 4, an inverter 5, a transfer gate 6, a NAND gate 7, a feedback inverter 8, a selector signal input terminal 10, a second clock (CLKB) input terminal 11, an external address input terminal 12, a tRPmin signal input terminal 13, a clock (TCLK) output terminal 20, and a delay clock output terminal 30. The clock/address controller circuit of this structure is additionally provided as a circuit dedicated to a test mode except a circuit for latching addresses, so it is sufficient that a clock signal corresponding to TCLK is directly applied from the outside to the RAM macro except when the memory is tested.

The first clock input terminal 1 receives a first clock signal (CLKA) from the evaluating tester. The clock output terminal 20 outputs the clock TCLK generated inside the device to the RAM macro. The clock monitor signal output terminal 3 sends a clock monitor signal M_TCLK to the evaluating tester. M_TCLK that is similar to TCLK is output to the evaluating tester for the purpose of monitoring. The delay element 4 delays the first clock signal.

The inverter 5 inverts an input signal into the opposite phase. The transfer gate 6 outputs the input signal based on whether or not the signal is input from the selector. The NAND gate 7 executes the NAND operation using the input signal to send the result thereof. The feedback inverter 8 holds the signals output from the transfer gate 6.

The selector signal input terminal 10 receives the selector signal from the evaluating tester and then sends the received selector signal to the transfer gate 6. In the circuit, the plural selector signal input terminals 10 are provided. According to the selector signal, a delay time for the signal received from the first clock input terminal 1 is determined. The second clock input terminal 11 receives a second clock signal from the evaluating tester.

The external address input terminal 12 receives an external address from the evaluating tester. The tRPmin test signal input terminal 13 is a test signal input terminal that is applied with high voltage when a tRPmin signal from the evaluating tester is tested. The internal address output terminal 2 sends the address to the RAM macro in sync with TCLK generated in the clock/address controller circuit. The delay clock output terminal 30 outputs the clock signal delayed with the delay element 4 to the evaluating tester.

Figure 4:
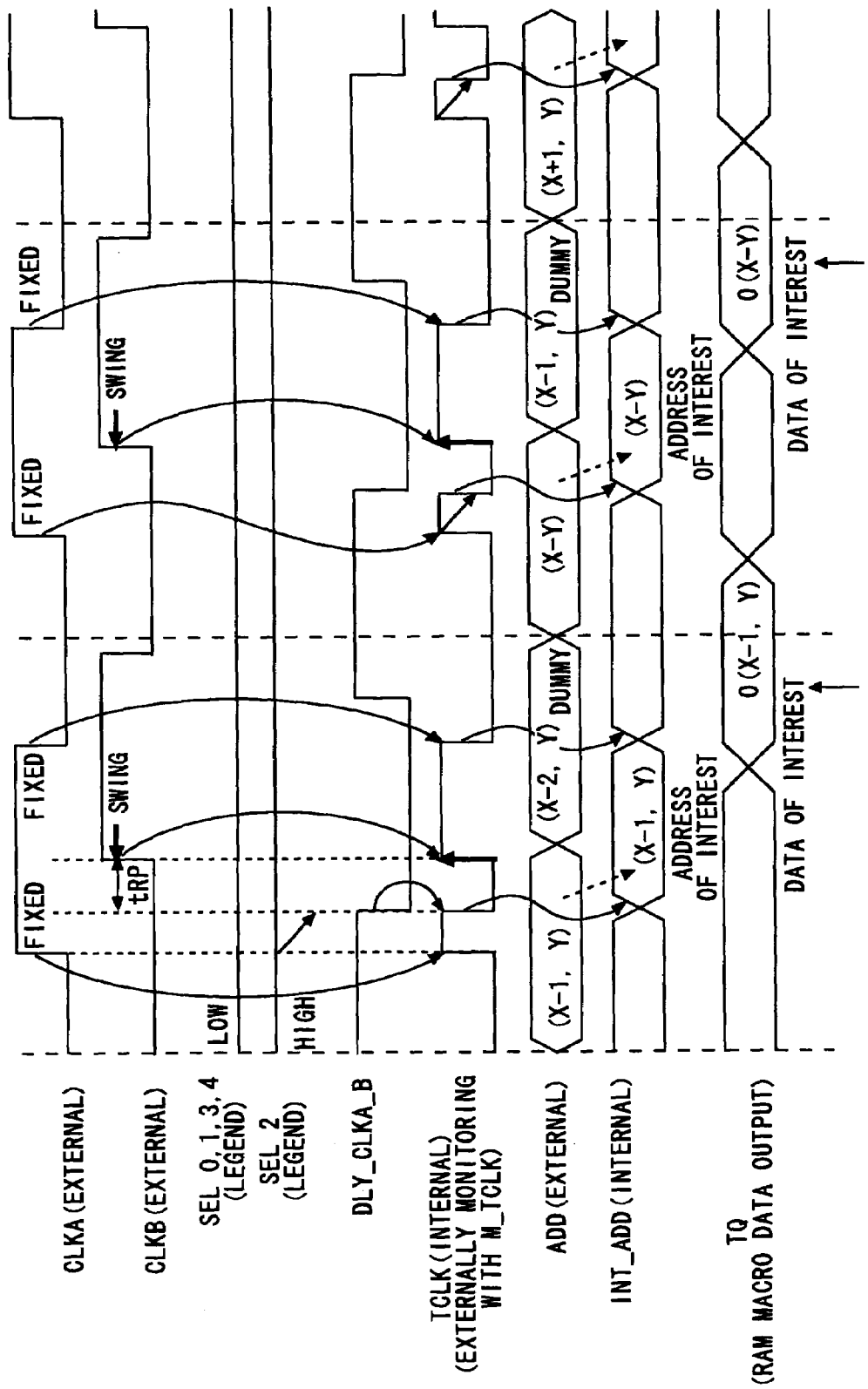
FIG. 4 is a timing chart showing a processing flow of a semiconductor device according to an embodiment of the present invention.

Referring next to a timing chart of FIG. 4, a test processing flow of the first embodiment of the present invention is described.

First, the first clock signal is input through the first clock input terminal 1. This clock is referred to as "CLKA". The input clock signal CLKA is sent from the clock output terminal 20. The clock applied from the clock output terminal 20 is referred to as "TCLK". At the same time, TCLK is applied to the outside from the clock monitor signal output terminal 3 as an M_TCLK signal, and monitored with the evaluating tester. The rising edge of CLKA is sync with the rising edge of TCLK (See CLKA and TCLK in FIG. 4).

The delay element 4 receives the clock signal CLKA from the first clock input terminal 1 and gives a delay thereto, and then outputs the delay clock signal to the inverter 5. The inverter 5 receives the delay clock signal from the delay element 4 to invert the signal into the opposite phase and supply the resultant delay clock signal to the transfer gate 6.

The transfer gate 6 receives the delay clock signal inverted into the opposite phase with the inverter 5. At this time, if SEL0 is selected by the evaluating tester, the selector signal is input to the transfer gate 6 from the selector signal input terminal 10 corresponding to SEL0. Receiving the selector signal, the transfer gate 6 outputs the delay clock signal from the inverter 5 to the delay clock output terminal 30. If the transfer gate 6 does not receive the selector signal, the transfer gate 6 does not send the delay clock signal from the inverter 5 to the delay clock output terminal 30.

If SEL0 is not selected, the delay clock signal from the delay element 4 is input to the next delay element 4. The next delay element 4 further delays the received delay clock signal and sends the same to the inverter 5. The delay clock signal from this delay element 4 is similarly inverted into the opposite phase with the inverter 5 and output to the transfer gate 6. The transfer gate 6 similarly sends, if SEL1 is selected and the selector signal is input from the corresponding selector signal input terminal 10, the delay clock signal to the delay clock output terminal 30. Otherwise, no delay clock signal is sent to the delay clock output terminal 30.

The same applies to subsequent ones. Thus, the number of the delay elements 4 which the clock signal pass through may be changed in accordance with the selected selector. The delay time is changed by the number of the delay elements. Which selector is selected is preset by means of a program etc., and the selector signal may be input from the corresponding selector signal input terminal 10 under the control of the program.

The delay clock signal sent from the transfer gate 6 to the delay clock output terminal 30 is inverted into the opposite phase, so the falling edge of the delay opposite-phase clock DLY_CLKA_B appears with a given delay from the rising edge of CLKA. Such a period from the rising edge of CLKA to the falling edge of the delay opposite-phase clock corresponds to a first state.

This first state is set as a read/write access state. More specifically, in response to the rising edge of CLKA (TCLK), the external address is latched and the word line corresponding to the address is activated. Therefore, the read/write access time tRAS is determined in accordance with the delay time. In short, tRAS can be appropriately set according to which selector is selected.

The clock signal CLKA, and the delay opposite-phase clock signal DLY_CLKA_B are also sent to the NAND gate 7. Hence, the falling edge of DLY_CLKA_B is sync with the falling edge of TCLK. A period following the falling edge of TCLK corresponds to a second state.

The second clock input terminal 11 receives a second clock signal, which is referred to as "CLKB". The clock signal CLKB is applied so as to show the rising edge a long enough time after the rising edge of CLKA. The input clock signal CLKB is sent to the clock output terminal 20 by way of the NAND gate 7. Through this procedure, the rising edge of CLKB is sync with the rising edge of TCLK. The second state is ended with the rising edge of CLKB. A third state follows the second state.

This second state is set as a precharge state. More specifically, in response to the falling edge of TCLK, the latched address is transferred as the internal address. The word line corresponding to this address is activated in response to the rising edge of CLKB. A period from the falling edge of TCLK to the rising edge is set as a precharge time tRP.

In order to test the precharge operation at high speeds, it suffices to advance the rising edge of CLKB. That is, tRP can be adjusted in accordance with the rising edge of CLKB applied from the second clock input terminal 11, so the test can be executed while setting tRP equivalent to the high-speed operation. To set tRP equivalent to the high-speed operation, a high-level signal is input from the tRPmin test signal input terminal 13.

After that, the falling edge of CLKA triggers the falling edge of TCLK. Following this, the falling edge of CLKB appears. From then on, the rising edge of CLKA appears, and the similar state transition is repeated.

Figure 3:
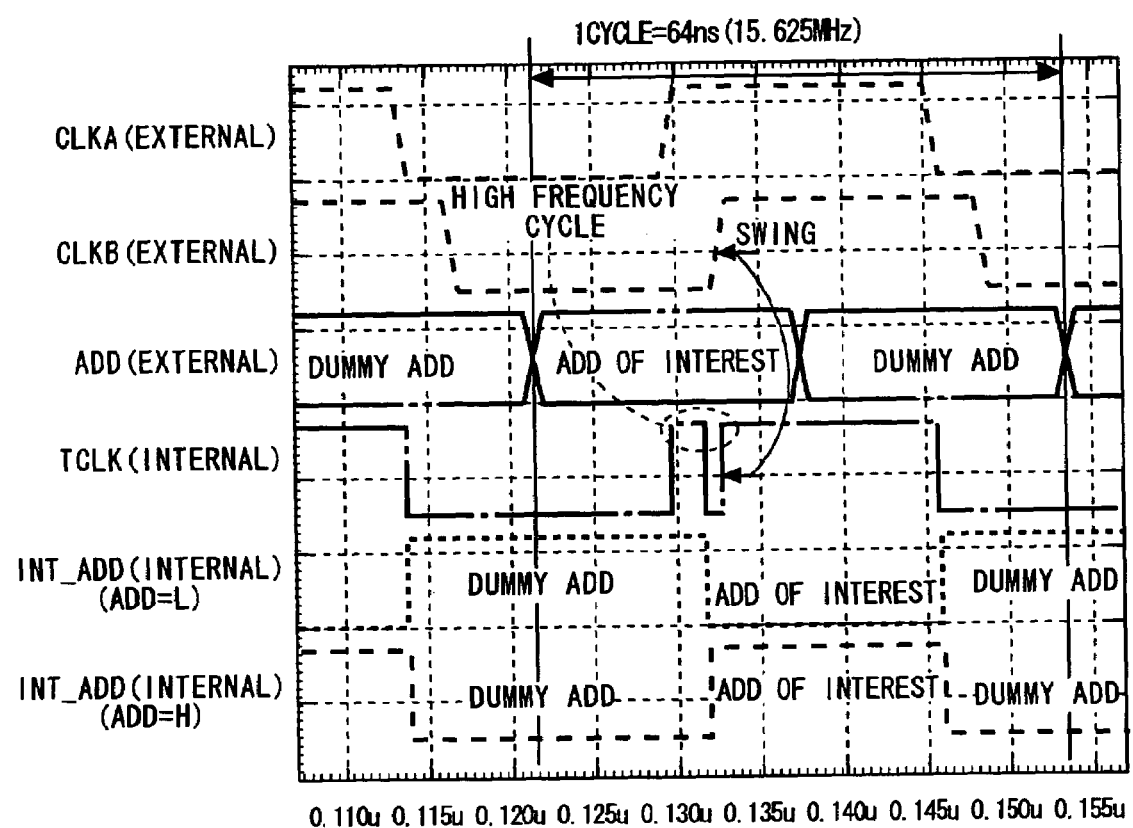
FIG. 3 is a waveform chart showing simulation test result of a semiconductor device circuit according to an embodiment of the present invention.
Figure 5:
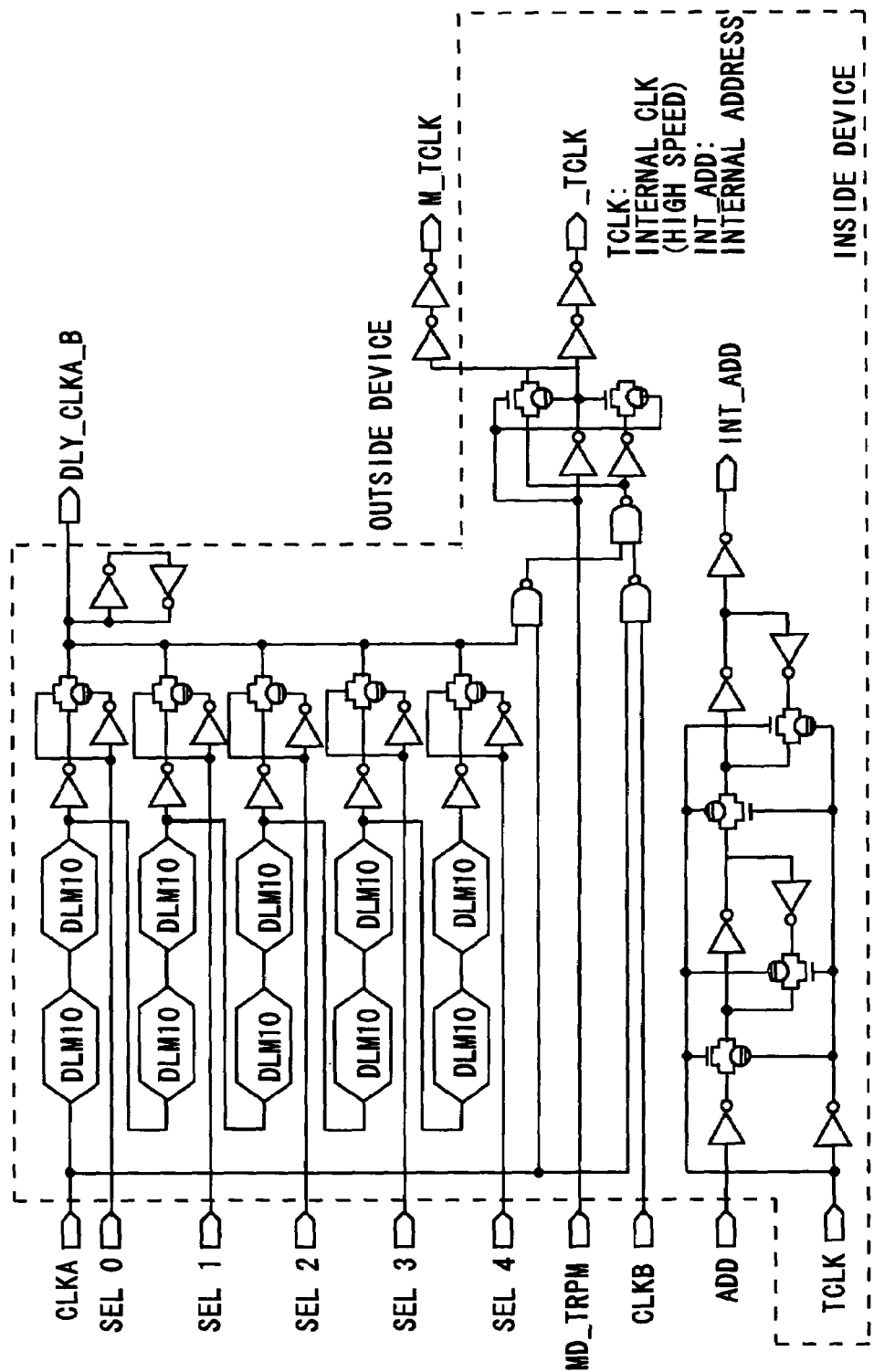
FIG. 5 is a circuit diagram showing the configuration of a clock/address controller circuit according to an embodiment of the present invention.

In this way, the state transition can be executed at as high speeds as high operational clock frequencies through the application of two kinds of low clock frequencies by use of the delay circuit. This method makes it possible to detect a memory failure resulting from the high-speed operation at the initial stage of memory test that must be carried out at low clock frequencies; when detected, the failure is immediately dealt with by replacing a memory cell, for example, thereby enhancing the yield of the memory. FIG. 5 shows the detailed circuit configuration in this case, and FIG. 3 is a waveform chart thereof. FIG. 5 is a circuit diagram which is used in a simulation of the device shown in FIG. 2. FIG. 3 shows a waveform obtained by a simulator as a result of the simulation. The circuit of FIG. 5 is the same as that of FIG. 2, and the waveform of FIG. 3 is the same as that of FIG. 4, so the detailed description of FIGS. 5 and 3 are omitted.

Second Embodiment

In the first embodiment of the present invention, the selector is used to set the read/write access time, but this time may be set as a precharge time instead. The circuit configuration of a second embodiment of the present invention is the same as that of the first embodiment of the invention as shown in FIG. 2, so its detailed description is omitted here.

Figure 6:
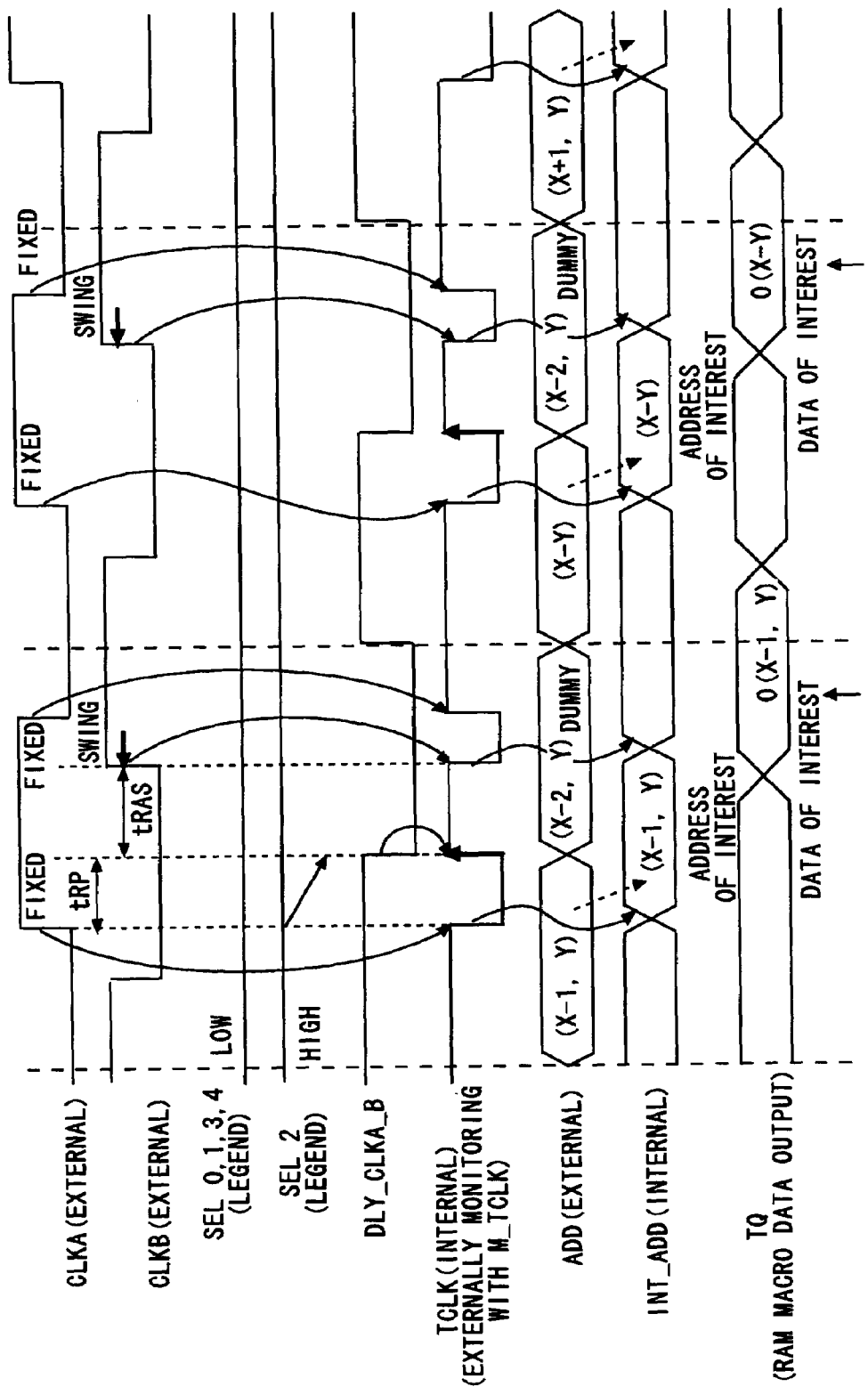
FIG. 6 is a timing chart showing a processing flow of a semiconductor device according to an embodiment of the present invention.

Referring to a timing chart of FIG. 6, the test processing flow of the second embodiment of the present invention is described.

First, the first clock signal is input from the first clock input terminal 1. This clock is referred to as "CLKA". The clock signal CLKA is input, and then the input clock signal is output from the clock output terminal 20. The clock applied from the clock output terminal 20 is referred to as "TCLK". The clock signal TCLK is also concurrently applied to the outside from the clock monitor signal output terminal 3 as M_TCLK signal, and monitored with the evaluating tester. The rising edge of CLKA is sync with the falling edge of TCLK.

The delay element 4 receives the clock signal CLKA from the input terminal 1 to delay the signal and then outputs the delay clock signal to the inverter 5. The inverter 5 receives the delay clock signal from the delay element 4 to invert the signal into the opposite phase to be sent to the transfer gate 6.

Thereafter, similar to the first embodiment of the present invention, the delay elements delay the signal based on the selector signal, and the transfer gate 6 outputs the delay clock signal. The falling edge of the delay opposite-phase clock DLY_CLKA_B appears with a given delay from the rising edge of CLKA. Such a period from the rising edge of CLKA to the falling edge of the delay opposite-phase clock corresponds to a first state.

This first state is set as a precharge state. That is, the precharge time tRP can be appropriately set according to which selector is selected. The falling edge of DLY-_CLKA_B is sync with the rising edge of TCLK. A state following the rising edge of TCLK is set as a second state. That is, tRP ranges from the rising edge of CLKA to the falling edge of the delay opposite-phase clock, and thus can be adjusted according to the selector.

The second state is set as the read/write access state. The period of the second state ranges from the rising edge of TCLK to the rising edge of CLKB that is input as a second clock. Therefore, the read/write access test can be executed at as high speeds as the high-speed operation by advancing the rising edge of CLKB.

Figure 7:
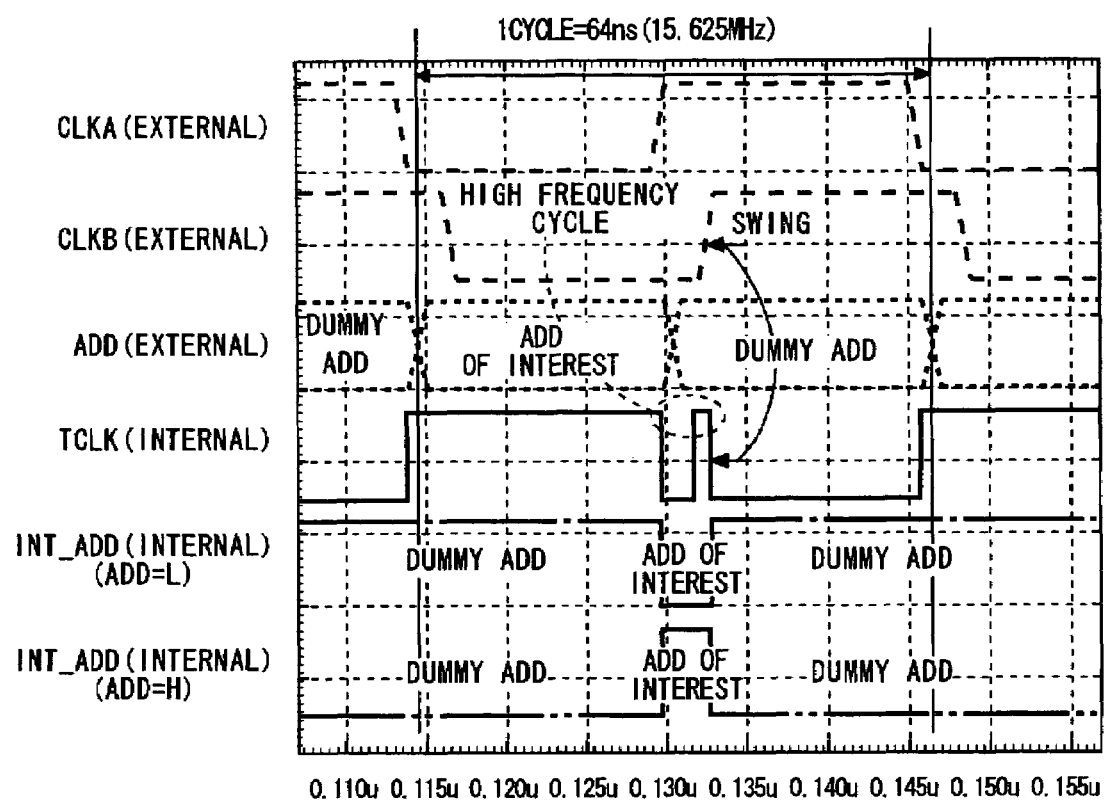
FIG. 7 is a waveform chart showing simulation test result of a semiconductor device circuit according to an embodiment of the present invention.
Figure 8:
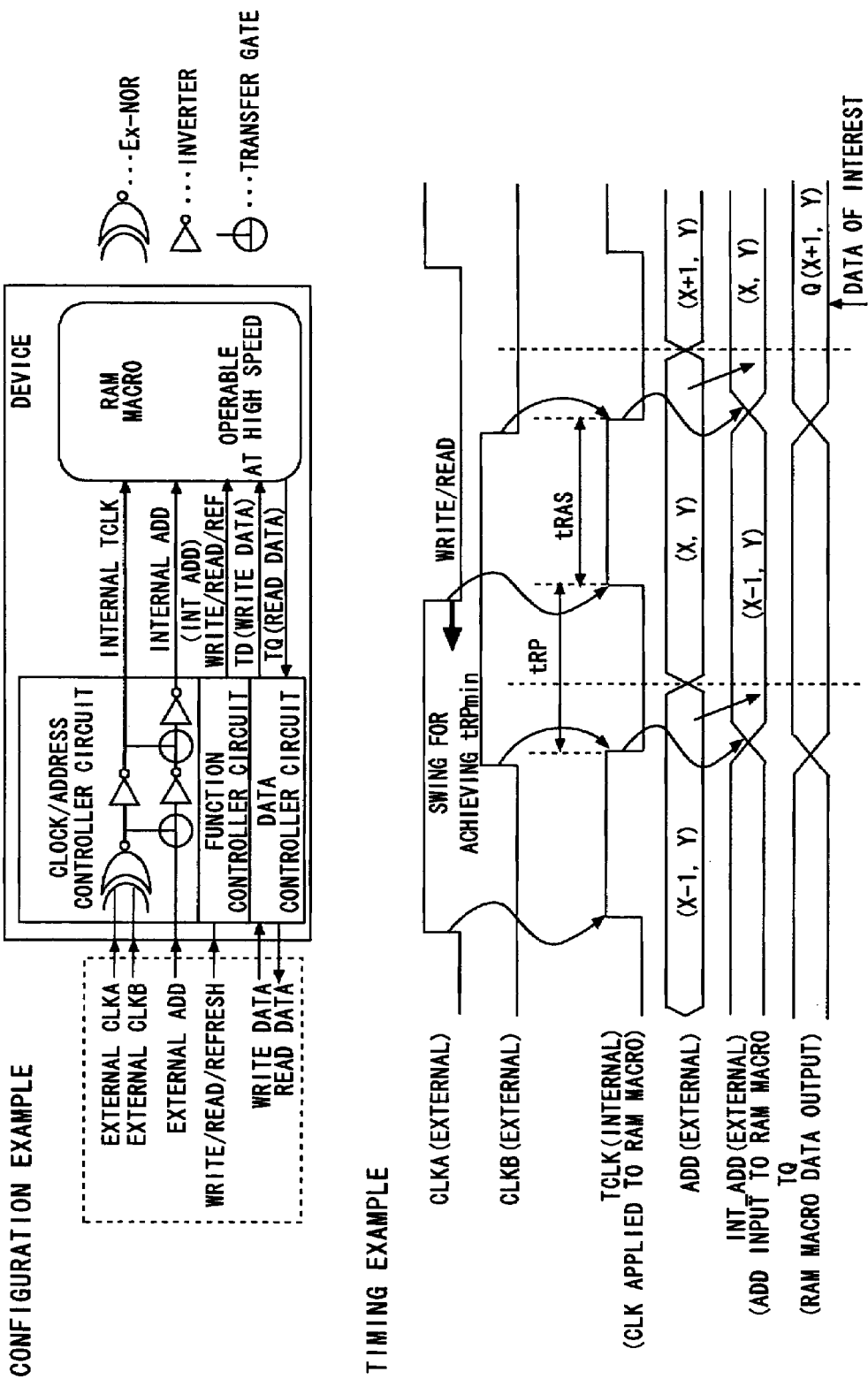
FIG. 8 shows a configuration example and timing example of a semiconductor device of the related art.

In this way, the state transition can be executed at as high speeds as the high operational clock frequencies through the application of two kinds of low clock frequencies by use of the delay circuit. This method makes it possible to detect a memory failure resulting from the high-speed operation at the initial stage of memory test that must be carried out at low clock frequencies; when detected, the failure is immediately dealt with by replacing a memory cell, for example, thereby enhancing the yield of the memory. FIG. 7 is a waveform chart thereof. FIG. 7 shows a simulation result as shown in FIG. 3. The detailed description is the same as the above description ob FIG. 6, so the detailed description of FIG. 7 is omitted.

It is apparent that the present invention is not limited to the above embodiment that may be modified and changed without departing from the scope and spirit of the invention.

What is claimed is:

1. A semiconductor device, comprising:
    a clock output part setting a first state in accordance with an input of a first clock, setting a second state in accordance with an input of a delay clock from a delay circuit and setting a third state in accordance with an input of a second clock; and
    the delay circuit delaying the first clock to output the delayed first clock as the delay clock.

2. The semiconductor device according to claim 1, wherein the delay circuit includes a selector switching a delay time.

3. The semiconductor device according to claim 1, further comprising a memory circuit,
    wherein the first state is a state of precharging the memory circuit, and the second state is a state of reading or writing data from or to the memory circuit.

4. The semiconductor device according to claim 2, further comprising a memory circuit,
    wherein the first state is a state of precharging the memory circuit, and the second state is a state of reading or writing data from or to the memory circuit.

5. A testing method for a semiconductor device, comprising:
    setting a first state in accordance with an input of a first clock;
    outputting a delay clock obtained by delaying the first clock;
    setting a second state in accordance with an input of the delay clock; and
    setting a third state in accordance with an input of a second clock.

6. The testing method for a semiconductor device according to claim 5, wherein a delay time of the delay clock can be switched with a selector.

7. The testing method for a semiconductor device according to claim 5, wherein the semiconductor device includes a memory circuit, and
    the first state is a state of precharging the memory circuit, and the second state is a state of reading or writing data from or to the memory circuit.

8. The testing method for a semiconductor device according to claim 6, wherein the semiconductor device includes a memory circuit, and
    the first state is a state of precharging the memory circuit, and the second state is a state of reading or writing data from or to the memory circuit.

* * * * *